United States Patent
Falik et al.

(10) Patent No.: US 7,161,505 B1
(45) Date of Patent: *Jan. 9, 2007

(54) A/D CONVERTER WITH COMPARATORS AND LOW-POWER DETECTION MODE FOR RESISTIVE MATRIX KEYBOARDS

(75) Inventors: Ohad Falik, Kfar Saba (IL); Victor Flachs, Rishon Lezion (IL)

(73) Assignee: Winbond Electronics Corporation (TW)

( * ) Notice: Subject to any disclaimer, the term of this patent is extended or adjusted under 35 U.S.C. 154(b) by 188 days.

This patent is subject to a terminal disclaimer.

(21) Appl. No.: 10/929,731

(22) Filed: Aug. 30, 2004

Related U.S. Application Data (63) Continuation of application No. 09/850,561, filed on May 7, 2001, now Pat. No. 6,784,810.

(51) Int. Cl.
*H03M 11/00* (2006.01)

(52) U.S. Cl. .................. 341/26; 341/14.1; 341/20; 345/168; 710/67

(58) Field of Classification Search .............. 341/26, 341/28, 29; 345/168; 340/14.1; 710/67
See application file for complete search history.

(56) References Cited

U.S. PATENT DOCUMENTS

| | | |
|---|---|---|
| 5,057,836 A | 10/1991 | Inaba |
| 5,448,236 A | 9/1995 | Shiga |
| 5,585,792 A | 12/1996 | Liu et al. |
| 5,619,196 A | 4/1997 | Escobosa |
| 5,929,790 A | 7/1999 | Lim |
| 5,983,116 A | 11/1999 | Nash et al. |
| 6,104,320 A | 8/2000 | Tu et al. |
| 6,266,049 B1 | 7/2001 | Nakai |
| 6,424,274 B1 | 7/2002 | Schnizlein et al. |
| 6,577,250 B1 | 6/2003 | Yee |

*Primary Examiner*—Albert K. Wong (57) ABSTRACT

An apparatus and method is disclosed for providing a fast, low power consumption, detection of at least one depressed key in a resistive matrix keyboard. The common contact of each row of a resistive matrix is connected to a first input of each of a plurality of analog/digital comparators capable of switching between high and low voltage states. A common predetermined reference voltage is applied to a second input of each analog/digital comparator using a digital to analog converter. The output of an analog/digital comparator is in a first state if the voltage level applied to the first input is higher than the reference voltage, and in a second state if the voltage level applied to the first input is lower than the reference voltage. The reference voltage is varied to identify which analog/digital comparator has experienced a change of state.

20 Claims, 6 Drawing Sheets

A/D CONVERTER WITH COMPARATORS AND LOW-POWER DETECTION MODE FOR RESISTIVE MATRIX KEYBOARDS

This application is a continuation of prior U.S. patent application Ser. No. 09/850,561 filed on May 7, 2001, now U.S. Pat. No. 6,784,810.

FIELD OF THE INVENTION

The present invention relates to the field of monitoring the operation of input devices. More particularly, the invention relates to an apparatus and a method for providing a fast, low power consumption, detection of at least one depressed key in a resistive matrix keyboard.

BACKGROUND OF THE INVENTION

Keyboards are widespread as a standard input device for many electronic devices. In Personal Computers (PC), for instance, the keyboard is the main input device available for users to enter data and interact with the PC.

PC keyboards usually comprise keys for typing, numbers, alphabetic letters, algebraic operators, special functions and more. Because of the large number of keys, it is customary to arrange the keys in a matrix, each key being implemented by a switch that has a unique two-dimensional location of the matrix, indicated by a row and column number. When a key is pressed, the mechanical operation is transferred to a corresponding switch, which in response changes its state to a conducting state. In order to detect depressed keys, the matrix is scanned to reveal switches that are closed (conducting), corresponding to a pressed key. A typical conventional keyboard further comprises an encoder, which translates the location (row and column) of the closed switch in the matrix into a code symbol that is later used to uniquely identify the depressed key.

Figure 1:
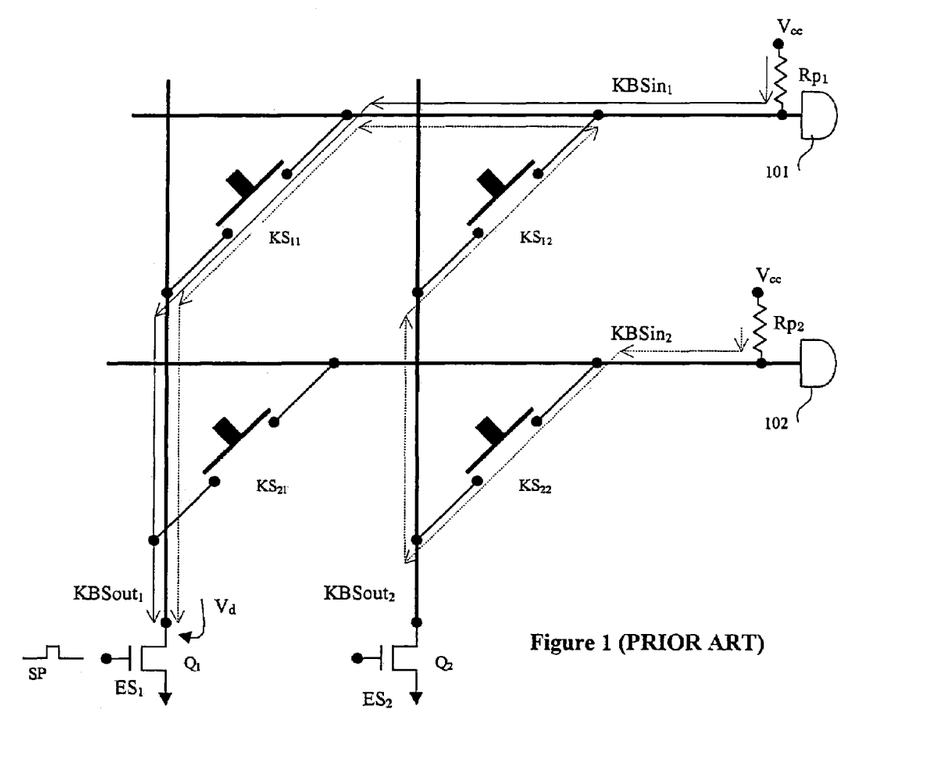
FIG. 1 schematically illustrates a prior art switch keyboard matrix implemented with conducting key switches using digital indication signals.

FIG. 1 schematically illustrates a prior art keyboard matrix depicting the matrix scan procedure that is required to detect a depressed key. The matrix is constructed from horizontal and vertical conducting lines, which form the matrix rows and columns, respectively. Two columns (KBSout$_1$, KBSout$_2$) are the matrix's drive lines, and two rows (KBSin$_1$, KBSin$_2$) represent the sense lines of the keyboard matrix. KBSout$_1$ and KBSout$_2$ are grounded through the N-channel MOSFET transistors, $Q_1$ and $Q_2$, respectively. Each transistor implements an Electronic Switch (ES), which is activated when a Scan Pulse (SP) is applied to its gate.

The row and column junctions of the keyboard matrix in FIG. 1 are coupled by the Key Switches (KS): $KS_{11}$, $KS_{12}$, $KS_{21}$, and $KS_{22}$. The matrix is scanned column by column by applying an SP to each drive line ES, one at a time. When an SP is applied to one of the drive lines ES (e.g., $ES_1$), the corresponding electronic switch that is connected to that drive line is turned ON (i.e., $Q_1$ is switched to its conducting state), thereby enabling electric current flow through that drive line to ground. If all the KSs are open, then no current flows and the voltage level of all the sense lines equals $V_{CC}$ (normally a "1" logic). If a $KS_{ji}$ on the scanned drive line is closed (i.e., a pressed key), when $ES_i$ is applied with a Scan Pulse (SP) KBSout$_i$ is pulled to LOW. Consequently, the electric voltage on the KBSin line that corresponds to the row that contains the closed switch (KBSin$_j$) drops to a lower level voltage $V_d$, thereby indicating the row number (i.e., j) and the column number (i.e., i) of the closed switch.

The value of the resistors Rp and the transistors' on voltage ($V_d$) are designed such that the row voltage $V_j$ ($V_j = V_d$, j=1,2) is identified as a "0" logic by the input gate on KBSin$_j$. This way, the depressed keys' rows and columns are located. For example, if an SP is applied to drive line KBSout$_1$ (i.e., to $ES_1$), and $KS_{11}$ is closed, the voltage on sense line KBSin$_1$ drops from $V_{CC}$ to $V_d$, indicating a key closure between the KBSout$_1$ column and the KBSin$_1$ row.

False detection occurs when several keys are simultaneously pressed. This is known in the art as the "phantom key" problem, that is, when closed circuits are formed by several KS being pressed simultaneously, which results in false indication of pressed keys. For example, if $KS_{11}$, $KS_{12}$, and $KS_{22}$ of the keyboard matrix are simultaneously pressed when the SP is applied to KBSout$_1$ ($ES_1$), the current that flows through $Rp_2$, $KS_{22}$, $KS_{12}$ (in the reverse direction) and $KS_1$, to ground, causes a voltage drop (from $V_{cc}$ to $V_d$) on KBSin$_2$, resulting in false indication of $KS_{21}$ as closed.

Solving the "phantom key" problem is necessary to achieve a proper detection whenever several keys are simultaneously pressed. This problem is also known as "n key rollover." The keyboard encoder is designed to resolve "n key rollover" conditions and "phantom" keys, and in addition, to perform switch contact debouncing.

Figure 2:
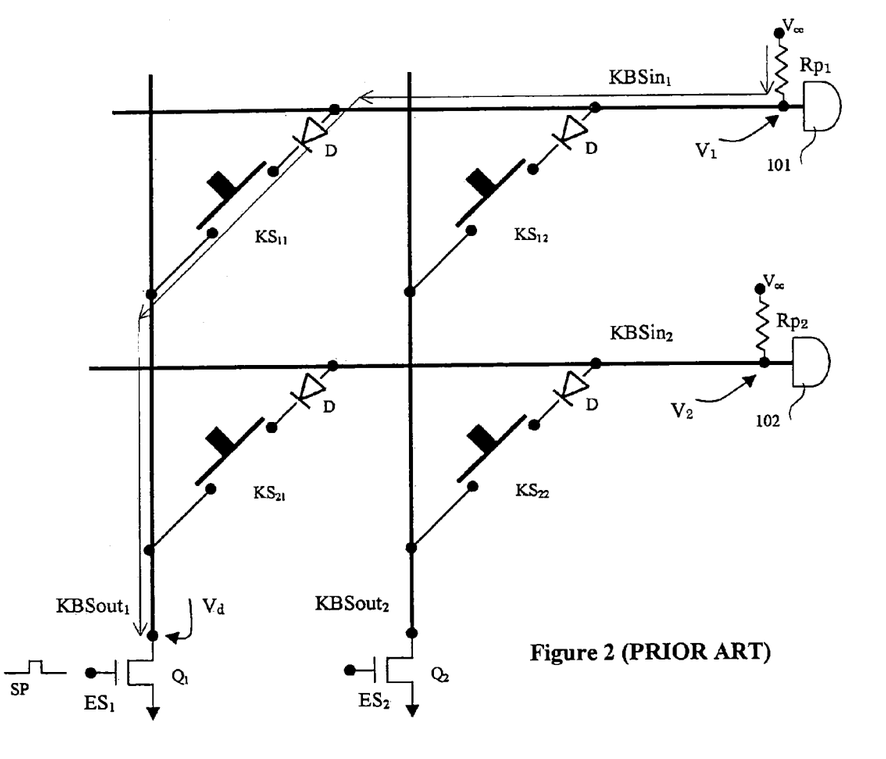
FIG. 2 schematically illustrates a prior art "n key rollover" protected switch keyboard matrix implemented by using serially connected diodes.

A prior art implementation that resolves "phantom" key problems is depicted in FIG. 2, which illustrates a keyboard construction with diodes connected in series to each KS of the keyboard matrix. The diodes in this implementation eliminate the "reverse" current flow through $KS_{12}$ (with reference to the previous example) and therefore prevent the "phantom key" problem. In this way, "n key rollover" is prevented. This solution does have the side effect that the diodes forward drop adds to $V_d$, which forces a higher value for the highest voltage that is still considered as a "0" logic state of the KBSin inputs. In addition, keyboard parts count is substantially increased (series diodes) resulting in an expensive assembly of the keyboard.

Figure 3:
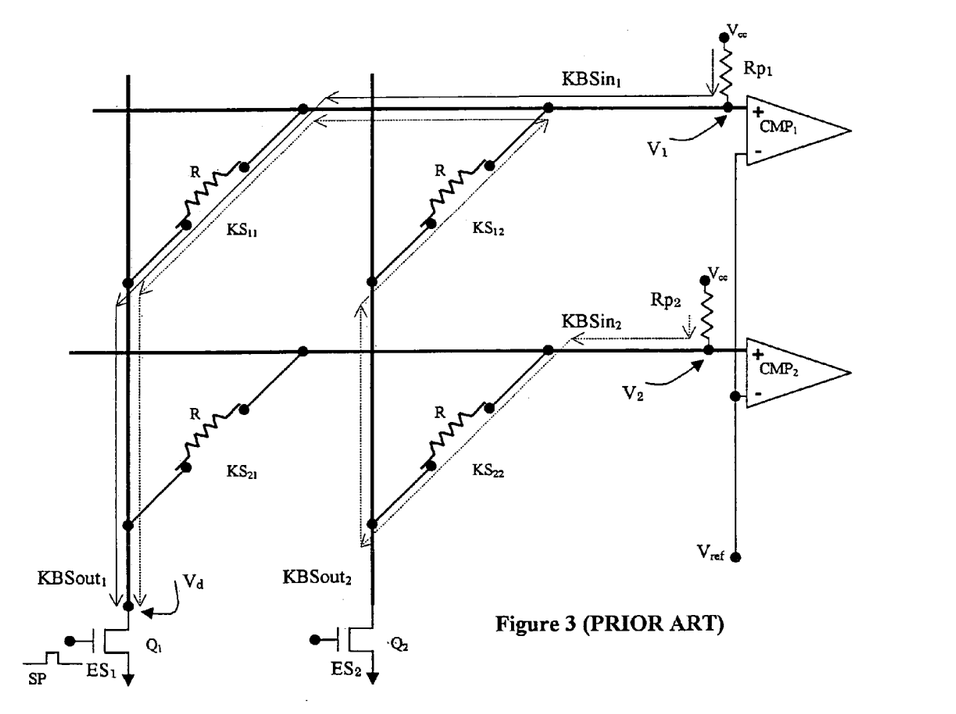
FIG. 3 schematically illustrates a prior art "n key rollover" protected resistive matrix keyboard monitored by comparators and a threshold voltage, using analog indication signals.

Another keyboard implementation that resolves the "n key rollover" problem is the resistive matrix keyboard, depicted in FIG. 3, in which a closed KS presents a non-zero resistance rather than a short circuit. When a key is pressed, its resistance provides the electrical connection required for indicating a key closure. The resistive matrix outputs a set of analog signals, rather than digital logic values. An array of comparators (CMP), each of which is fed by a predetermined threshold voltage, is used to distinguish between the voltage levels cause by one, or "n key" pressing.

A diversity of analog voltage levels appears at the resistive matrix rows KBSinj, in accordance to the number of keys pressed. The voltage difference between an actual (real) KS closure and a faulty closure indication (i.e., "phantom" key) is relatively small, so that the threshold voltage level ($V_{ref}$) should be carefully determined to ensure a correct detection of the pressed keys by the set of comparators. However, deviations of the KS resistance values in the matrix result in changes of the voltage levels, which may be a source for faulty KS closure detection. The voltage level variation is affected by tolerances of the KS resistance values during production and by environmental effects like temperature, moisture, dust and corrosion of the contacts. Moreover, the threshold voltage levels usually fluctuate over time and temperature, contributing more imprecision.

In the design and manufacture of a portable PC (e.g., a "laptop"), a great effort is invested to substantially reduce the device's size, weight, and power consumption. Reduction of the power consumption is essential to achieve a long term operation of electronic mobile and wireless devices operating from a battery power supply. In order to reduce the device's size, and increase the efficiency, an embedded controller (EC) is utilized to interact with the laptop's input/output (I/O) devices.

The power consumption of the EC is influenced by the controller operation. It is desired to reduce the controller activity to a minimum by executing a fast matrix scan and by halting the controller operation when it is not needed. When halted, the system can be in a standby mode, in which the matrix is only sensed to detect a press condition on any of the keys, or on a specific subset of them, as an indication for activity. This is known as "any key pressed" detection, and it is performed by applying one SP to all the drive lines and testing the sense lines voltage levels. If a key is pressed it is detected by a logic "0" in one of the KBSin inputs, this indication is utilized as a wake event to the EC. In response, once the activity in the EC is resumed, it will use the normal key scan process to detect exactly which key is pressed.

The Mitsubishi 3886 device is a prior art micro-computer with an embedded comparator circuit, which is utilized to interface with a resistive matrix. The comparator circuit compares simultaneously up to eight (8) analog inputs with a single reference voltage. An internal resistive voltage divider is utilized to produce the reference voltage. Only one division ratio is provided or the use of an external voltage reference is required, with the increased cost associated. The comparator circuit is operated by software, and thus the microcomputer is always involved in monitoring the keyboard. Any key detection is possible only when the processor is active since no wakeup interrupt is available from the comparator. Also, processor activity is required for controlling the current consumption of the circuit via timed enable and disable. No hardware support is provided for debouncing the comparator output against noise, or for controlling the thresholds in case of misfit.

Other prior art methods utilize Analog to Digital (A/D) converters to monitor and detect the resistive matrix sense line signals (KBSin). A/D conversion of the matrix analog signals enables digital processing with higher accuracy, and overcomes the resistive matrix imprecision that was previously discussed. The Hitachi H8S/2144 and H8S/2148 series are prior art single-chip microcomputers with an embedded A/D converter. A/D conversion of the sense line signals is selected through an analog multiplexer. A successive approximation A/D is utilized to measure the input voltage of one input at a time. A complete scan of the matrix sense lines involves a sequence of conversions. For a complete scan of the matrix n times m conversions are required, where n is the number of rows and m is the number of columns. This substantially increases the current consumption required for the conversion due to the large number of conversion operations and the continuous intervention of the processor. In addition, this scheme does not allow "any key press detection" since the KBSin signals need to be scanned.

All the methods described above have not yet provided satisfactory solutions for fast "n key rollover" with low power consumption implementations for resistive matrix keyboards.

SUMMARY OF THE INVENTION

It is an object of the present invention to provide an apparatus and a method for low power "any key pressed" detection for a resistive keyboard matrix that does not require software activity in the controller.

It is another object of the present invention to provide an apparatus and method for fast detection of actual key depression in a resistive keyboard matrix, with improved tolerance to resistive values variations and system noise rejection through debouncing.

It is still another object of the present invention to overcome voltage deviations caused by tolerances of pull-up resistors, being part of a monolithic control circuit of a resistive matrix.

Other objects and advantages of the invention will become apparent as the description proceeds.

The present invention is directed to a method for providing a fast, low power consumption, detection of at least one depressed key in a resistive matrix keyboard. The common contact of each row of a resistive matrix is connected to a first input of each of a plurality of analog/digital comparators capable of switching between high and low voltage states. A common predetermined reference voltage applied to a second input of each analog/digital comparator is generated by using a digital to analog converter. The output of each of the analog/digital comparators is in a first state if the voltage level applied to the first input is higher than the reference voltage, and in a second state if the voltage level applied to the first input of the analog/digital comparator is lower than the reference voltage. The contacts of all columns of the resistive matrix are simultaneously connected to a voltage level that enables current to flow through the resistors that are connected to each column, and changes in the output state of one or more analog/digital comparators are sought. The generation of the reference voltage and the connection of columns are periodically repeated if no change is detected. Upon detecting a change of state of at least one analog/digital comparator, the reference voltage is varied in an up-going or in a down-going direction by using the digital to analog converter, so that the varied reference voltage is equal to the voltage that is applied to the first input of each analog/digital comparator, at least once. Whenever the varied reference voltage reaches the voltage that is applied to the first input of an analog/digital comparator, a change of state in that analog/digital comparator is detected, and the digital word of the digital to analog converter that corresponds to the value of the reference voltage reached that caused the change of state in that analog/digital comparator is obtained. The digital word obtained for each analog/digital comparator may be stored in a memory. Preferably, changes in the output state of one or more analog/digital comparators are sought at the lowest frequency that is sufficient to detect all key press and release events.

Preferably, a signal indicating a change of state of at least one analog/digital comparator or the absence of such a change of state is output into a control circuit. The frequency of seeking changes in the output state of at least one analog/digital comparator is controlled by the control circuit, to be lower if no change in the output state of at least one analog/digital comparator is obtained. The frequency of varying the reference voltage is controlled by the control circuit, to be higher in response to a change in the output state of at least one analog/digital comparator.

Preferably, the value of the common reference voltage is determined by the following steps:

(a) defining a first range of voltages expected to be at an input of each analog/digital comparator, the first range of voltages corresponding to a voltage that results from an actual depression of a key in a row;

(b) defining a second range of voltages expected to be at an input of each analog/digital comparator, the second range of voltages being spaced from the first range of voltages, and corresponding to voltages that result from: no actual depression of a key, or from a false depression of a key, or from multiple depression of keys in a row; and (c) determining a value of the common reference voltage to be between the first range of voltages and the second range of voltages.

The circuitry for detecting a change of state combines all outputs of the plurality of comparators, so as to allow the simultaneous detection of a change of state without periodically scanning the columns of the resistive matrix.

The present invention is also directed to an apparatus for providing a fast, low power consumption detection of at least one depressed key in a resistive matrix keyboard, where the apparatus comprises:

(a) a plurality of analog/digital comparators, each analog/digital comparator of which having a first input connected to a common contact of a different row of a resistive matrix and capable of switching between high and low voltage states;

(b) a digital to analog converter, connected to a second input of each of said plurality of analog/digital comparators, for generating a common predetermined reference voltage and for applying the common predetermined reference voltage to the second input of each of the plurality of analog/digital comparators, wherein the output of each of the plurality of analog/digital comparators is in a first state if a voltage level applied to the first input of an analog/digital comparator is higher than the reference voltage, and in a second state if the voltage level applied to the first input of the analog/digital comparator, is lower than the reference voltage;

(c) circuitry for detecting a change of state in at least one analog/digital comparator;

(d) a control circuit for controlling a frequency of detection of a change of state and for varying the reference voltage in an up-going or a down-going direction by inputting different digital words to the digital to analog converter at a desired rate; and (e) a data bus for outputting the digital words of the digital to analog converter that correspond to the values of the reference voltage that cause a change of state in each of said plurality of analog/digital comparators.

Preferably, the apparatus may further comprise at least one memory for storing digital words of the digital to analog converter upon receiving corresponding control commands from the control circuit and a data bus for outputting the digital words stored in at least one memory. An AND/NAND gate may be used for detecting a change of state in one or more analog/digital comparators, each input of the AND/NAND gate being connected to the output of a different analog/digital comparator. The circuitry for detecting, a change of state may combine all outputs of the plurality of analog/digital comparators, to allow the simultaneous detection of a change of state without periodically scanning columns of the resistive matrix.

The foregoing has outlined rather broadly the features and technical advantages of the present invention so that those skilled in the art may better understand the Detailed Description of the Invention that follows. Additional features and advantages of the invention will be described hereinafter that form the subject matter of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention, it may be advantageous to set forth definitions of certain words and phrases used throughout this patent document: The terms "include" and "comprise" and derivatives thereof, mean inclusion without limitation, the term "or" is inclusive, meaning "and/or"; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, to bound to or with, have, have a property of, or the like; and the term "controller,"/"processor," or "apparatus" means any device, system or part thereof that controls at least one operation. Such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document. Those of ordinary skill should understand that in many instances (if not in most instances), such definitions apply to prior, as well as future uses of such defined words and phrases.

BRIEF DESCRIPTION OF THE DRAWINGS

For a more complete understanding of the present invention, and the advantages thereof, reference is now made to the following descriptions taking in conjunction with the accompanying drawings, wherein like numbers designate like objects, and in which.

DETAILED DESCRIPTION OF THE INVENTION

A resistive matrix keyboard device generates analog signals that correspond to the depression of keyboard keys. To determine which key is pressed (or which keys are pressed), the matrix is systematically scanned by applying a Scan Pulse (SP) to one of the drive lines and monitoring the sense lines signal levels. In the prior art implementation illustrated in FIG. 3, the sense lines are monitored by CMPs with a reference threshold voltage $V_{ref}$ that is fed into each CMP.

In FIG. 3, $V_1$ is the input voltage level of $CMP_1$ presented by $KBSin_1$, and $V_2$ is the input voltage level of $CMP_2$ presented by $KBSin_2$. The voltage $V_d$ is the voltage drop over a closed drive line ES. Each CMP output is determined by the comparison result between its corresponding inputs: if the positive input level (marked with a "+" sign) is greater than the negative input level (marked with a "−" sign), then the CMP output set to "1", otherwise it is reset to "0". For instance, if the voltage level $V_1$ of row $KBSin_1$ is greater than $V_{ref}$ ($V_1 > V_{ref}$), then $CMP_1$ output is set to "1", other (if $V_1 < V_{ref}$), it is reset to "0".

Using the FIG. 3 notations, when $KB_{11}$ is closed and an SP is applied to $ES_1$, the sense line voltage levels $V_1$ and $V_2$ are given by (assuming $V_d \approx 0$):

$$5V_1 = \frac{V_{CC} - V_d}{R + R_p} \cdot R + V_d \cong V_{CC} \cdot \frac{R}{R + R_p}; V_2 = V_{CC} \quad (1)$$

Assuming that $KS_{12}$ and $KS_{22}$ are closed as well (i.e., a "phantom key" problem), when an SP is applied to $KBSout_1$ ($ES_1$), the sense line voltage levels $V'_1$ and $V'_2$ are given by (assuming $V_d \approx 0$)

$$V'_1 = \frac{(V_{CC} - V_d) \cdot 2R}{R + R_p \| (R_p + 2R)} + V_d \cong V_{CC} \cdot \frac{2R}{R + \frac{R_p \cdot (R_p + 2R)}{2 \cdot (R_p + R)}} \quad (2)$$

$$V'_2 = V'_1 + \frac{(V_{CC} - V'_1) \cdot 2R}{R_p + 2R} \quad (3)$$

Since $V_{CC} > V'_1$ from the above, it is clear that $V'_2 > V'_1$, so that "phantom key" problems can be detected. When all the KS are open, all the sense line voltage levels equal $V_{CC}$, so that all the CMPs outputs are "1" when the scan is performed. If a key closure occurs, different voltage levels are obtained, such as $V'_1$, which is a true indication of a KS closure, and $V'_2$ which is a false indication.

Figure 7:
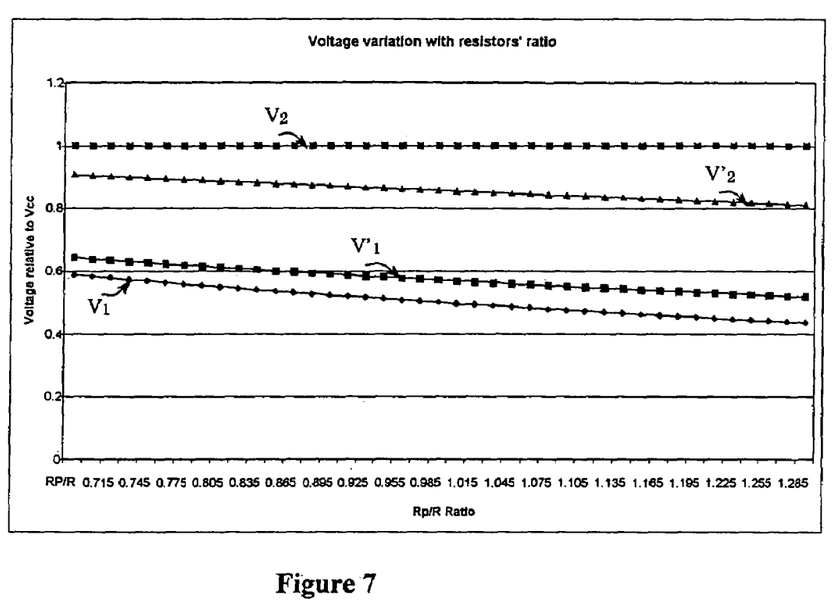
FIG. 7 graphically illustrates the variation of the resistive matrix sense lines voltage against the resistors ratio.

FIG. 7 illustrates the variation of the resistive matrix sense lines voltages, $V'_1$ and $V'_2$, against the resistor ratio $R_p/R$ in the form of a graph (in the figure $V_{CC}=1$ and $V_d \approx 0$). The voltage levels of $V_1$ and $V_2$ are also depicted in FIG. 7, to exemplify the difference between one key and multiple key pressing shown in FIG. 3. Evidently, as illustrated in FIG. 7, the inequality $V'1 < V'_2$ is satisfied.

In order to resolve the "n key rollover" condition, the threshold voltage level $V_{ref}$ is chosen to be greater than the true key closure indication (i.e., $V'_1 < V_{ref}$), which will cause a state toggle from "1" to "0" at the respective CMP when an SP is applied to the respective drive line. To eliminate false indications, the threshold voltage level should be smaller than any possible false indications (e.g., $V'_2 > V_{ref}$), such as $V'_2$ in the example described hereinabove, such that the state of the CMPs remains unchanged ("1") when false indication voltage levels are obtained.

Figure 4:
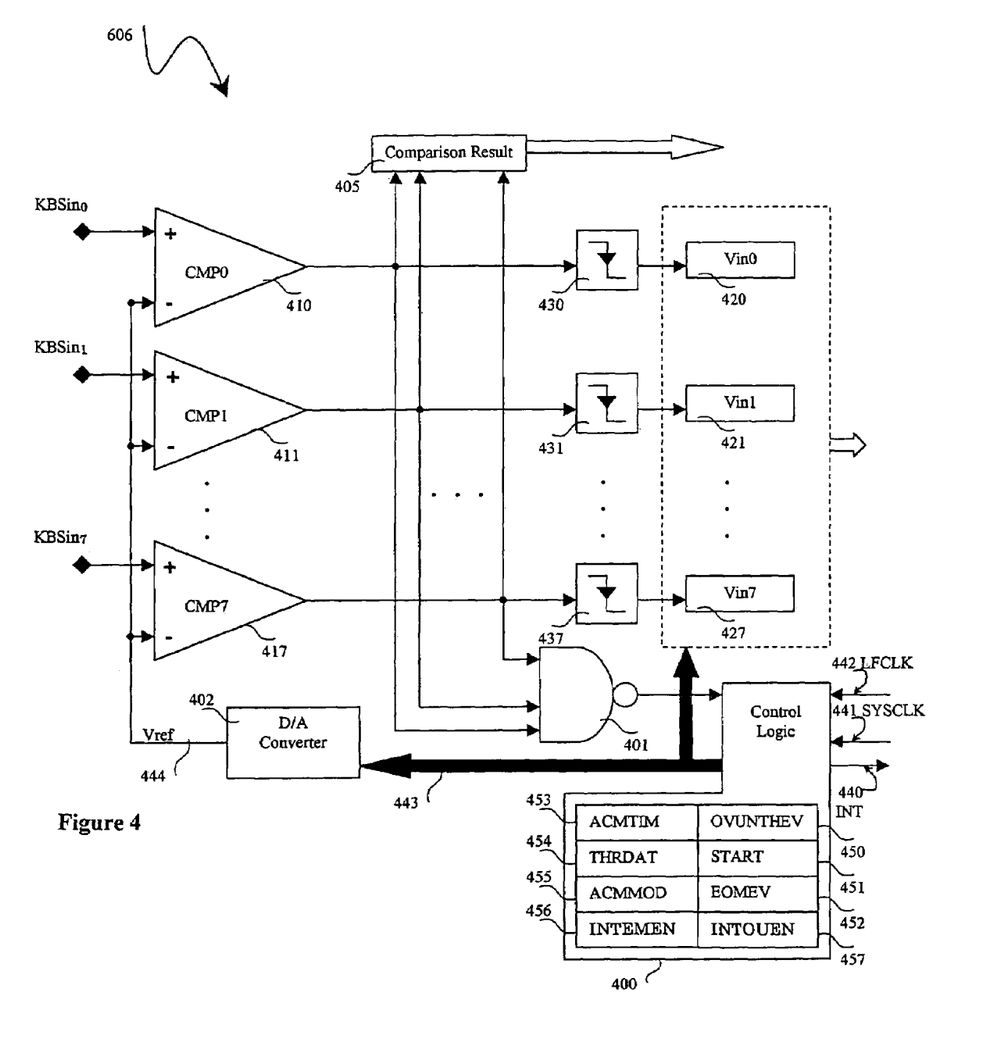
FIG. 4 schematically illustrates a low-power consumption circuit for the detection of actual activation of keys in a resistive matrix keyboard, according to an advantageous embodiment of the invention.

FIG. 4 schematically illustrates a low power consumption circuit for the detection of actual activation of keys in a resistive matrix keyboard, according to an advantageous embodiment of the invention. The circuit employs a fast and efficient method for keyboard monitoring, which enables resolving "n key rollover" conditions. In order to increase power efficiency, a low power state is utilized when key closures are not detected, this being an "IDLE" state, and while waiting for a key depression, the microcomputer operation is not required and it may be stopped.

Figure 6:
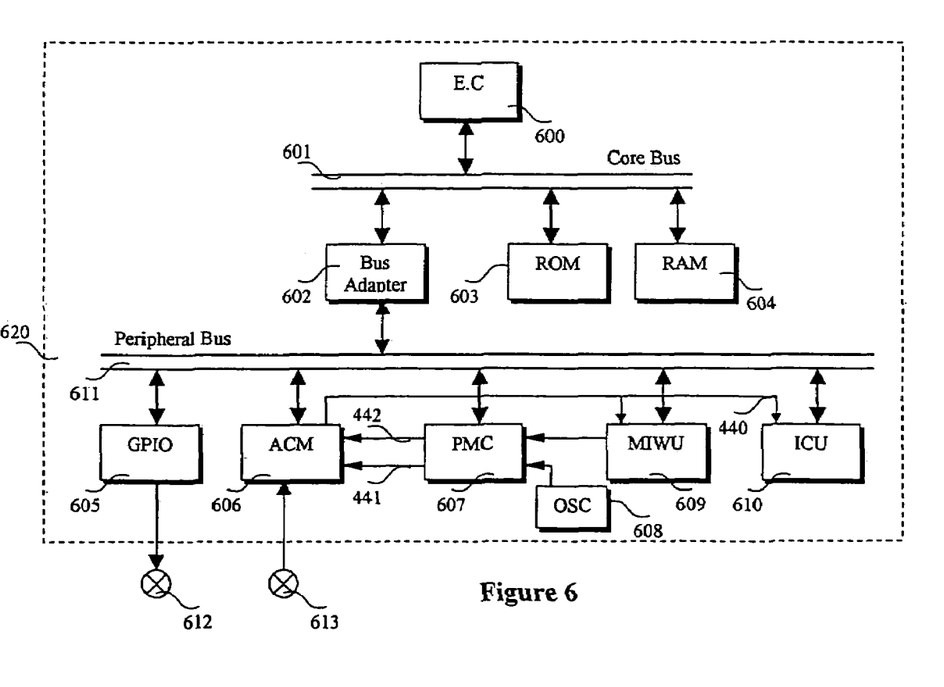
FIG. 6 schematically illustrates a connection of an analog comparators monitor (ACM) into an IC device.

The ACM 606 in FIG. 4 is integrated in an IC 620 shown in FIG. 6. The IC 620 comprises a General Purpose I/O (GPIO) unit 605, an Analog Comparators Monitor (ACM) unit 606, a Power Mode Controller (PMC) unit 607, a Multi-Input Wake-Up (MIWU) unit 609, an oscillator (OSC) unit 608, and an Interrupt Control Unit (ICU) 610. The GPIO, ACM, PMC, MIWU, and the ICU are attached to the IC's Peripheral Bus 611. The Peripheral Bus 611 is connected to the IC's Core Bus 601, via the Bus Adapter 602. Said Bus Adapter is actually a bridging device, which enables transactions between the Peripheral Bus 611 and the Core Bus 601 to take place. The Core Bus 601 is also attached to a processing unit, that is the IC's Embedded Controller (EC) 600. Also attached to the Core Bus 601 are the IC's memory devices, these are the Read Only Memory (ROM) device 603, and the Random Access Memory (RAM) device 604.

The PMC 607 receives the OSC 608 pulse rate and utilizes it to generate two different clock rates, the IC's low frequency clock (LFCLK) 442 and the system clock (SYSCLK) 441. The ACM is fed with both clock signals, 442 and 441, and utilizes them according to the operating mode that is dictated by the EC 600. The GPIO provides the IC with different I/O ports that are required for attachment with external I/O devices. The resistive matrix drive lines, $KBSout_0$–$KBSout_{15}$, are connected to the GPIO port 612, while the sense lines of the resistive matrix, $KBSin_0$–$KBSin_7$, are attached to the ACM input port 613. The MIWU 609 and ICU 610 units receive the input 440 (INT) from the ACM 606 indicating key closure, which is utilized by the ICU 610 and the MIWU 609 to exit a low power state. More particularly, when key closure indication appears on 440, the MIWU 609 activates the IC's units that are required to resolve the keyboard operation, while the ICU issues an interrupt to the EC 600, if the interrupt is enabled. More details on the operation of a similar IC without an ACM may be found in National Semiconductor's "PC87570 Keyboard and Power Management Controller" publication.

The structure of the ACM module 606 is schematically illustrated in FIG. 4. The Control Logic 400 generates the timing for the operation of the ACM. Two different clock inputs are utilized by the Control Logic 400, the IC's system clock SYSCLK 441 and a Low Power Frequency Clock (LFCLK) 442. When the ACM is operating in its normal operation mode, the SYSCLK input 441 is utilized to time the ACM operations. The LFCLK input 442 is utilized to trigger events and to time the ACM operation while operating in the low power mode. The Control Logic 400 conveys a digital value 443 to the input of the D/A converter 402 and the registers 420–427. This value defines the reference voltage 444 that is utilized for the compare operation, which is carried out by a set of comparators 410–417. Each one of said comparators 410–417 is associated with one of the inputs $KBSin_0$–$KBSin_7$, respectively.

The Control Logic 400 also comprises control and status flags and registers, the operation of which will be described hereinafter. The START control flag 451 is utilized to trigger the ACM operation. The End-of-Measurement Event (EOMEV) flag 452 is utilized to indicate the end of voltage level measurement for all eight (8) inputs. The Over/Under Threshold Event (OVUNTHEV) flag 450 is used to indicate that at least one input is below the threshold value. When the ACM 606 is operating in the "any key pressed mode" the value for the threshold voltage $V_{ref}$ is determined according to the value programmed in the Threshold Data (THRDAT) register 454. The Control Logic 400 also comprises the ACM mode (ACMMOD) control flags 455, which are used to set the ACM mode of operation, the ACM Timing Control (ACMTIM) register 453, the Interrupt from End-of-Measurement Event Enable (INTEMEN) flag 456 and the Interrupt from Over/Under Threshold Event Enable (INTEOUEN) 457.

With reference to FIG. 4, the output state of the comparators is "0" when the reference voltage 444 is below the respective KBSin signal value. When the reference voltage 444 is above the KBSin voltage level, the comparator output state is "1". The reference input to the comparators 444 is valid only after the settling time of the D/A converter 402. The D/A converter is a rail-to-rail D/A, though other types that cover only part of the range may be utilized. The resolution of the D/A should be high enough to differentiate between a correct key press $V'_1$ and a false key press $V'_2$ illustrated in FIG. 7, with the addition of some margins for noise and other system variations. However, if selecting the magnitude R and $R_p$ to be of the same order, and if the D/A full scale equals the supply voltage of the resistive matrix, that is $V_{CC}$, then a six (6) bit D/A is sufficient. For the outputs of the comparator to be valid an additional delay should be accounted for, that is the time for the comparator's operation (i.e., settling time).

The output of the comparators 410–417 may be processed utilizing a single compare result operation. More precisely, the voltage level of the inputs $KBSin_0$–$KBSin_7$ can be determined according to one compare operation of the comparators 410–417, where the single compare operation is carried out with consideration of the comparators 410–417 and the D/A 402 delay times, as was discussed above. However, to resolve switch contact debouncing problems, the result of a policy of "majority vote" over the comparators output is utilized. The "majority vote" policy operation also reduces the effect of noise on the compare result. For example, a "majority vote" policy may be such in which the result of three (3) out of five (5) consecutive compare operations is required to determine the KBSin voltage.

The Comparison Result register 405 enables reading the result of the compare operation as it holds the last state at the outputs of the comparators 410–417. The edge detectors 430–437 detect a falling edge of the compare result from "1" to "0". Once an edge is detected the D/A's input value 443 is latched in the output register 420–427 of the respective channel, and the status bit OVUNTHEV 450 in the Control Logic 400 is set.

Figure 5:
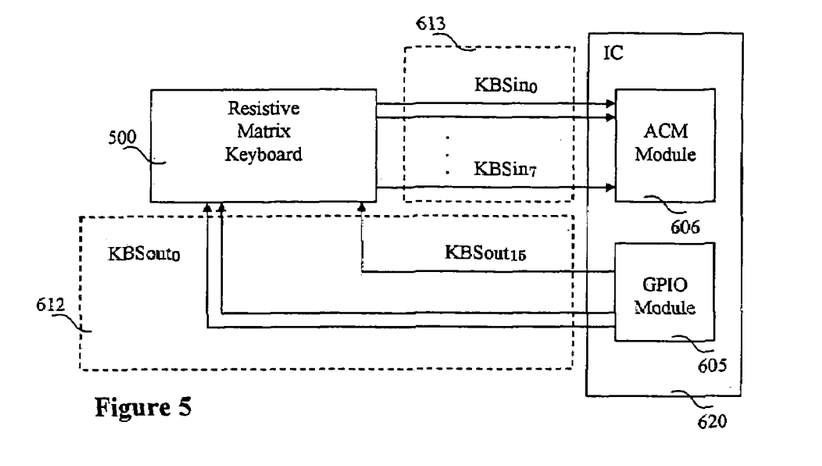
FIG. 5 schematically illustrates a connection of the resistive keyboard matrix in an integrated circuit (IC) embodiment of the invention.

The system in FIG. 5 shows how the ACM 606 is connected to a resistive matrix 500. The ACM 606 is embedded into an IC 620. The IC 620 supplies to the resistive matrix 500 the SP signals through the IC's output lines $KBSout_0$–$KBSout_{15}$ 612. The resistive matrix 500 sense lines are connected to the ACM via the IC's input lines $KBSin_0$–$KBSin_7$ 613. The following operations are performed in order to detect which key or combination of keys is pressed. For each column i of the matrix, the respective output $KBSout_i$ ($0 \leq i \leq 15$) is sequentially pulled to low state by asserting the SP signal. All other outputs $KBSout_j$ ($0 \leq j \leq 15$; $j \neq i$) are kept disabled by deasserting their respective SP signals. Then the inputs, $KBSin_0$–$KBSin_7$ 613, are simultaneously measured utilizing the sequence described hereby.

Prior to the measurement the ACM 606 is configured to its operation conditions, that is the proper delays for the D/A 402 and comparators 410–417 settling is configured, and the comparators 410–417 output state is set to enable measurement of the inputs 613 in the active mode. The measurement starts by writing a value of "1" by the EC 600 to the START bit 451 in the Control Logic 400. At this point further EC 600 intervention is not required until all KBSin values are measured and the EC is free to handle other tasks or reduce power by executing a WAIT instruction.

The Control Logic 400 starts the measurement by enabling the D/A 402 and starting the sequence of ramping its output 444, starting with a value of "0", waiting for the D/A output 444 to settle, enabling the comparators 410–417 to perform a measurement (which may include repetitive comparison for noise reduction), detecting a falling edge at the comparator output and, if such a falling edge occurs, latching the D/A setting value 443 into the result registers 420–427. Once all of the comparators' outputs have changed to low, or the maximum value of the D/A has been reached, the measurement is completed by clearing the busy indication (i.e., setting the EOMEV bit 452 in the Control Logic 400) and if the interrupt is enabled (i.e., the interrupt INTEMEN bit 456 in the Control Logic 400 is set to high) setting the interrupt output INT 440 to high.

When the compare operation starts (in the active state mode), the Control Logic 400 starts driving the D/A input 443 with its low-scale value, which is less than $V_1$ (i.e., the key pressed value). In this state, regardless of the voltage level of inputs $KBSin_0$–$KBSin_7$, the comparators 410–417 state is "1", since $V_{ref} < KBSin_j$ ($0 \leq j \leq 7$). The inputs of the NAND gate 401 are all "1" and hence its output is set to "0". As was previously explained, during the compare operation the Control Logic unit 400 progressively increases the D/A input on 443. During this operation, at some point the reference voltage $V_{ref}$ on 444 will be higher than the voltage level of one of the inputs $KBSin_j$ ($0 \leq j \leq 7$), since the voltage levels are limited to the values $V'_1 \leq KBSin_j \leq V'_2 < V_{CC}$ ($0 \leq j \leq 7$).

If one or more keys are pressed, the respective inputs voltage level $KBSin_j$ ($0 \leq j \leq 7$) will be set to the corresponding voltage values $V'_1 \leq KBSin_j \leq V'_2 < V_{CC}$ ($0 \leq j \leq 7$), indicating KS closure. In such a case, when the reference voltage exceeds one of the $KBSin_j$ voltage levels, $V_{ref} > KBSin_j$, the state of the respective comparator output, CMP, will change from "1" to "0". The state of the NAND gate 401 will also change, but from "0" to "1", thereby generating an indication to the Control Logic unit 400 that one of the comparators state has changed. This indication is utilized to detect key closure when performing an "any key pressed" detection.

When the EC 600 detects the end of conversion through the interrupt signal INT 440 or by checking the value of the EOMEV flag 452 periodically, it will read the measurement results from the registers 420–427 and clear the EOMEV flag 452 in the Control Logic 400. Then the processor will use the resistive matrix voltage equations discussed above to translate the input voltage measured and to decide for each key if it is pressed or depressed.

The ACM is activated in the low power state after a predetermined period of time during which no KS closure is detected, or in any other case in which a low power mode is required, or just for a reduction of the current consumption between key strokes (the gap may be in the order of fifty (50) to one hundred (100) milliseconds (msec) for a fast typist to seconds when doing operations such as Internet browsing).

In its low power state, the EC 600 activity is halted or reduced to a minimum and the ACM is set to detect any key press activity without the need for intervention from the EC. To further reduce current consumption, the ACM is triggered by a divided version of the LFCLK input 442. The LFCLK input 442 is utilized to perform a low frequency detection of any key press in order to detect KS closure. Low rate detection is sufficient since the minimal key closure time is relatively long (fifty (50) to one hundred (100) milliseconds is typical for a "skilled" typist).

This state is referred to as the low power "any key pressed" detection mode. It is desired to have the LFCLK frequency as low as possible to achieve better power efficiency. It is also desired that the LFCLK frequency will be high enough to enable a "wake up" from the low power state with full detection of KS closure, so that "waking up" into a fast typing rate is still possible, and depressed keys are correctly received.

The ACTTIM register 453 in the Control Logic 400 allows the processor and its software to configure the key scan operation to occur once in "n" LFCLK clock cycles. In the example of a 32.768 KHz clock, and if the response time desired is the maximum forty (40) milliseconds, then "n" should be about one thousand three hundred (1300). Either any "n" or a predetermined set of values may be used.

In the low power mode, the THRDAT register 454 in the Control Logic 400 is loaded with a constant value, which is used as the setting point for the D/A converter which generates the corresponding $V_{ref}$ 444 threshold voltage. This value needs to be with safe margins of noise below the $V_2$ ($V_2=V_{CC}$) value, which is the inputs state when all keys are open and above the maximal value expected for a single key closure $V_1$.

The processor should configure the ACM for operation in power down mode by selecting the low power mode of operation and defining the threshold to be used. After doing that it should activate all the scan lines $KBSout_0$–$KBSout_{15}$ 612 by asserting high the SP signals of all columns in the matrix (or a subset of them if it is desired to detect the pressing of only a subset of the keys). Following this, the low power mode operation of the ACM should be enabled by setting the ACMMOD bits 455 to the low power state.

Once the low power ACM operation is enabled by the processor, no additional processor support is required for detecting the closing of any key and the processor may perform other activities, or reduce the power consumption by executing WAIT instruction or entering "sleep" power down modes.

In the low power mode, most of the time, the D/A 402 is disabled (for example, by providing it with an input of "zero zero" ("00")) and the comparators are also disabled to reduce their leakage current consumption. Once every "n" clock cycles of the LFCLK 442, the D/A converter 402 is loaded with a programmable constant value, generating a constant reference voltage on the CMPs negative inputs 444. This is a threshold level $V_{ref}$ that is utilized for monitoring the resistive matrix sense lines. Assuming that all the KSs are open, the sense lines voltage level equals $V_{CC}$, $KBSin_j=V_{CC}(0 \leq j \leq 7)$. The threshold voltage is smaller than $V_{CC}$ ($V_{CC}>V_{ref}$) so that the CMPs output state is set to "1". When the comparators 410–417 are enabled for measurement, the CMPs outputs are written to the Comparison Result register 405, and a no key closure indication ("0") is produced by the NAND circuit 401.

If a key closure occurs while the measurement is enabled, one or more sense line voltage levels are set to a smaller level than $V_{ref}$. As a result, the respective CMP outputs changes from "1" to "0". This change is stored in the Comparison Result register 405, and simultaneously the NAND logic gate 401 produces a key depression indication signal ("1"). When the Control Logic unit 400 receives the key depression signal from 401 and if the interrupt is enabled (i.e., the INTOUEN control flag 457 in the Control Logic 400 is set to high), it issues an interrupt request (INT 440) to "wake up" the EC 600 from its low power "sleep." At this stage, the microcomputer is activated and the ACM operation is changed to its active state. With this embodiment, the resistive matrix sense lines are monitored by hardware operation without any software activity, enabling the complete halt of the EC 600 operation.

The above examples and description have, of course, been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. A method for detecting at least one depressed key in a keyboard comprising a resistive matrix, wherein each of a plurality of comparators has a first input operable to receive a voltage from one of a plurality of sense lines in the resistive matrix and a second input operable to receive a reference voltage, the method comprising:
    detecting a first change of state in at least one of the comparators;
    varying the reference voltage in response to detecting the first change of state;
    detecting a second change of state in a first of the comparators caused by varying the reference voltage; and
    obtaining a value associated with the reference voltage that caused the second change of state.

2. The method of claim 1, further comprising:
    further varying the reference voltage;
    detecting a third change of state in a second of the comparators caused by varying the reference voltage; and
    obtaining a second value associated with the reference voltage that caused the third change of state.

3. The method of claim 2, wherein:
    a digital-to-analog converter is operable to generate the reference voltage;
    varying and further varying the reference voltage comprise supplying a plurality of digital values to the digital-to-analog converter;
    obtaining the value associated with the reference voltage that caused the second change of state comprises obtaining one of the digital values; and
    obtaining the value associated with the reference voltage that caused the third change of state comprises obtaining another of the digital values.

4. The method of claim 3, wherein:
    each comparator is operable to:
        output a first logical value when the reference voltage applied to the second input of the comparator is less than the voltage applied to the first input of the comparator; and
        output a second logical value when the reference voltage applied to the second input of the comparator is greater than the voltage applied to the first input of the comparator; and
    detecting the second change of state comprises detecting an edge in the output of the first comparator.

5. The method of claim 4, wherein obtaining one of the digital values comprises latching the digital value in a register in response to detecting an edge.

6. The method of claim 1, wherein detecting the first change of state comprises using one of: an AND gate and a NAND gate, the gate having a plurality of inputs operable to receive outputs from all of the comparators.

7. The method of claim 6, wherein:
a digital-to-analog converter is operable to generate the reference voltage; and
detecting the first change of state comprises detecting the first change of state in a low power mode by:
  disabling the digital-to-analog converter and the comparators; and
  periodically enabling the digital-to-analog converter and the comparators, providing a programmable constant value to the digital-to-analog converter, and determining if an output of the gate changes.

8. An apparatus for detecting at least one depressed key in a keyboard comprising a resistive matrix, the apparatus comprising:
a plurality of comparators, each comparator having a first input operable to receive a voltage from one of a plurality of sense lines in the resistive matrix and a second input operable to receive a reference voltage;
a controller operable to detect a first state change in at least one of the comparators and vary the reference voltage; and
a memory operable to store a value associated with the reference voltage that causes a second state change in a first of the comparators.

9. The apparatus of claim 8, wherein:
the controller is operable to further vary varying the reference voltage; and
the memory is operable to store a second value associated with the reference voltage that causes a third state change in a second of the comparators.

10. The apparatus of claim 9, further comprising a digital-to-analog converter operable to generate the reference voltage, wherein the controller is operable to vary and further vary the reference voltage by providing a plurality of digital values to the digital-to-analog converter.

11. The apparatus of claim 10, wherein:
each comparator is operable to:
  output a first logical value when the reference voltage applied to the second input of the comparator is less than the voltage applied to the first input of the comparator; and
  output a second logical value when the reference voltage applied to the second input of the comparator is greater than the voltage applied to the first input of the comparator; and
the apparatus further comprises a plurality of edge detectors, each edge detector operable to detect an edge in the output of one of the comparators.

12. The apparatus of claim 11, wherein the memory comprises a plurality of registers, each register operable to be latched to store one of the digital values in response to one of the edge detectors detecting an edge.

13. The apparatus of claim 8, further comprising one of: an AND gate and a NAND gate, the gate having a plurality of inputs operable to receive outputs from all of the comparators.

14. The apparatus of claim 13, wherein:
the apparatus further comprises a digital-to-analog converter operable to generate the reference voltage; and
the controller is operable to detect the first state change in a low power mode by:
  disabling the digital-to-analog converter and the comparators; and
  periodically enabling the digital-to-analog converter and the comparators, providing a programmable constant value to the digital-to-analog converter, and determining if an output of the gate changes.

15. A keyboard, comprising:
a resistive matrix comprising a plurality of sense lines;
  a plurality of comparators, each comparator having a first input operable to receive a voltage from one of the sense lines and a second input operable to receive a reference voltage;
a controller operable to detect a first state change in at least one of the comparators and vary the reference voltage; and
a memory operable to store a value associated with the reference voltage that causes a second state change in a first of the comparators.

16. The keyboard of claim 15, wherein:
the controller is operable to further vary the reference voltage; and
the memory is operable to store a second value associated with the reference voltage that causes a third state change in a second of the comparators.

17. The keyboard of claim 16, further comprising:
a digital-to-analog converter operable to generate the reference voltage, wherein the controller is operable to vary and further vary the reference voltage by providing a plurality of digital values to the digital-to-analog converter; and
a plurality of edge detectors, each edge detector operable to detect an edge in an output of one of the comparators, each comparator operable to:
  output a first logical value when the reference voltage applied to the second input of the comparator is less than the voltage applied to the first input of the comparator; and
  output a second logical value when the reference voltage applied to the second input of the comparator is greater than the voltage applied to the first input of the comparator.

18. The keyboard of claim 17, wherein the memory comprises a plurality of registers, each register operable to be latched to store one of the digital values in response to one of the edge detectors detecting an edge.

19. The keyboard of claim 15, further comprising one of: an AND gate and a NAND gate, the gate having a plurality of inputs operable to receive outputs from all of the comparators.

20. The keyboard of claim 19, wherein:
the keyboard further comprises a digital-to-analog converter operable to generate the reference voltage; and
the controller is operable to detect the first state change in a low power mode by:
  disabling the digital-to-analog converter and the comparators; and
  periodically enabling the digital-to-analog converter and the comparators, providing a programmable constant value to the digital-to-analog converter, and determining if an output of the gate changes.

* * * * *

UNITED STATES PATENT AND TRADEMARK OFFICE
CERTIFICATE OF CORRECTION

PATENT NO. : 7,161,505 B1
APPLICATION NO. : 10/929731
DATED : January 9, 2007
INVENTOR(S) : Ohad Falik and Victor Flachs Page 1 of 1

It is certified that error appears in the above-identified patent and that said Letters Patent is hereby corrected as shown below:

Column 2, line 17, delete "$KS_1$" and replace with -- $KS_{11}$ --;

Column 6, line 12, delete "/" between "controller" and "processor";

Column 7, in Equation (1), delete "$5V_1$" and replace with -- $V_1$ --.

Signed and Sealed this

Nineteenth Day of June, 2007

JON W. DUDAS
*Director of the United States Patent and Trademark Office*